United States Patent
Shegai et al.

(10) Patent No.: US 12,085,859 B2
(45) Date of Patent: Sep. 10, 2024

(54) PATTERNING OF MULTILAYER TRANSITION METAL DICHALCOGENIDES

(71) Applicant: SMENA Catalysis AB, Gothenburg (SE)

(72) Inventors: Timur Shegai, Gothenburg (SE); Battulga Munkhbat, Västra Frölunda (SE)

(73) Assignee: SMENA Catalysis AB, Gothenburg (SE)

( * ) Notice: Subject to any disclaimer, the term of this patent is extended or adjusted under 35 U.S.C. 154(b) by 155 days.

(21) Appl. No.: 17/794,929

(22) PCT Filed: Jan. 25, 2021

(86) PCT No.: PCT/SE2021/050041
§ 371 (c)(1),
(2) Date: Jul. 22, 2022

(87) PCT Pub. No.: WO2021/154141
PCT Pub. Date: Aug. 5, 2021

(65) Prior Publication Data
US 2023/0118913 A1 Apr. 20, 2023

(30) Foreign Application Priority Data
Jan. 27, 2020 (SE) .................. 2050069-0

(51) Int. Cl.
*G03F 7/32* (2006.01)
*C09K 13/00* (2006.01)

(52) U.S. Cl.
CPC ............... *G03F 7/32* (2013.01); *C09K 13/00* (2013.01)

(58) Field of Classification Search
None
See application file for complete search history.

(56) References Cited

U.S. PATENT DOCUMENTS

| 2015/0255661 A1 | 9/2015 | Nam et al. |
| 2019/0228966 A1 | 7/2019 | Wang et al. |

FOREIGN PATENT DOCUMENTS

| CN | 102583356 A | 7/2012 |
| WO | WO-2019/108366 A1 | 6/2019 |

OTHER PUBLICATIONS

Extended European Search Report for Application No. EP 21747869.2, dated Jan. 2, 2024.
International Search Report and Written Opinion for Application No. PCT/SE2021/050041, dated Mar. 8, 2021.
(Continued)

*Primary Examiner* — Allan W. Olsen
(74) *Attorney, Agent, or Firm* — MARSHALL, GERSTEIN & BORUN LLP

(57) ABSTRACT

A method for forming a patterned 2D material is disclosed. The method comprises providing a multilayer 2D material comprising at least two layers of the 2D material, and pre-patterning the multilayer 2D material by using a lithographic patterning method followed by a first etching process in order to form a pre-patterned structure in the multilayer 2D material. Further, the method comprises applying a second etching process on the pre-patterned structure such that a first shape of at least one portion of the patterned structure is transformed into a second shape thereby forming a patterned multilayer 2D material sample, wherein the second etching process is an anisotropic etching process.

5 Claims, 2 Drawing Sheets

(56) References Cited

OTHER PUBLICATIONS

Office Action, corresponding Sweden patent application No. 2050069-0, dated Oct. 9, 2020.
Z. Shi et al., "Patterning Graphene with Zigzag Edges by Self-Aligned Anisotropic Etching", *Advanced Materials*, vol. 23, pp. 3061-3065 (2011).
Y.Y. Stehle et al., "Anisotropic Etching of Hexagonal Boron Nitride and Graphene: Question of Edge Terminations", *Nano Letters*, vol. 17, 7306-7314 (2017).
M. Yamamoto et al, "Anisotropic Etching of Atomically Thin $MoS_2$", *Journal of Physical Chemistry C*, vol. 117, 25643-25649 (2013).
E.V. Castro et al., "Biased bilayer graphene: semiconductor with a gap tunable by the electric field effect", *Phys. Rev. Lett.* 99, (2007).
S. H. Jones and D. K. Walker, "Highly Anisotropic Wet Chemical Etching of GaAs Using $NH_4OH:H_2O_2:H_2O$", *Journal of The Electrochemical Society*, vol. 137, No. 5, pp. 1653-1654 (1990).
A. I. Dago et al., "Direct Patterning of p-Type-Doped Few-layer $WSe_2$ Nanoelectronic Devices by Oxidation Scanning Probe Lithography", *ACS Applied Materials & Interfaces*, vol. 10, 40054-40061 (2018).
W. Kern, "The Evolution of Silicon Wafer Cleaning Technology", *Journal of the Electrochemical Society*, vol. 137, No. 6, pp. 1887-1892 (1990).
T. He et al., "Etching Techniques in 2D Materials", *Advanced Materials Technologies*, vol. 4, 1900064 (2019).
B. Munkhbat et al., "Transition metal dichalcogenide metamaterials with atomic precision", *Nature Communications*, vol. 11, pp. 1-8 (2020).

PATTERNING OF MULTILAYER TRANSITION METAL DICHALCOGENIDES

TECHNICAL FIELD

The present disclosure relates to fabrication of nanostructured 2D materials. In particular the present disclosure relates to the fabrication of multilayer transition metal dichalcogenides (TMDCs) with atomically-sharp interfaces.

BACKGROUND

The ability to isolate materials just a few atoms thick has led to the discovery of graphene, monolayer transition metal dichalcogenides (TMDCs), and other important two-dimensional (2D) materials. The one-dimensional (1D) edges of these 2D-materials typically exhibit properties that are distinctly different from their 2D bulk analogues.

TMDC materials find use in many research and technology disciplines, motivated by their excellent optical, mechanical, electronic, nano-photonic and catalytic properties. Their ability to be exfoliated down to monolayer thickness and form van der Waals heterostructures, which in turn give rise to intriguing Moiré physics, opens wide possibilities for designing new materials with tailored properties and novel functionalities. Most popular TMDCs, such as MoS2 and WS2, are semiconducting in their 2H phase and much effort is thus focused on exploring these semiconducting and excitonic properties.

Edge states of TMDC materials are also highly promising for many applications. For example, density functional theory predicts that zigzag-terminated edge states are metallic and ferromagnetic, while armchair edge states are semiconducting and nonmagnetic. The metallic edges also exhibit high electro- and photo-catalytic activity, notably as a non-precious analog of platinum for hydrogen evolution reaction. Due to symmetry reduction at the edges, these states also show potential for nonlinear optics applications, such as enhanced second harmonic generation.

For several important applications, such as catalysis and sensing, it is important to increase the number of edge states. To reach this goal many different methods, including chemical treatment, surface engineering, thermal annealing and other emerging techniques have been employed. However, the control of these methods over the metallic-edge and semiconducting-face states is relatively limited. For example, in 'Patterning Graphene with Zigzag Edges by Self-Aligned Anisotropic Etching' Shi, Z., et al., Advanced Materials, 2011. 23(27): p. 3061-3065, a method of anisotropic dry etching of graphene using sequential oxygen and hydrogen plasma was reported. However, this and other similar methods suffer from a general drawback of poor scalability.

Thus, there is a need for new and improved methods for fabricating TMDC materials with accurate control over their edge states.

SUMMARY

It is therefore an object of the present disclosure to provide a method for forming a patterned multilayer 2D material, and a patterned multilayer 2D material manufacturing according to the method which overcome some or all of the drawbacks of presently known solutions.

In particular, it is an object of the present disclosure to provide a method for fabricating TMDC materials which allows accurate control of the edge-face composition. The term exemplary is in the present context to be understood as serving as an instance, example or illustration.

In accordance with a first aspect of the present disclosure there is provided a method for forming a patterned 2D material. The method comprises providing a multilayer 2D material comprising at least two layers of the 2D material, and pre-patterning the multilayer 2D material by using a lithographic patterning method followed by a first etching process in order to form a pre-patterned structure in the multilayer 2D material. Further, the method comprises applying a second etching process on the pre-patterned structure such that a first shape of at least one portion of the patterned structure is transformed into a second shape thereby forming a patterned multilayer 2D material sample, wherein the second etching process is an anisotropic etching process.

Hereby demonstrating a new and simple etching method, which allows fabricating nanostructured TMDC material with atomically sharp zigzag edges and with an accurate hexagonal shape, which is formed in accordance with the crystallographic axes of the material. The effect operates in wide parameter range, including individual nanoholes of arbitrary shapes and sizes, hole arrays of various types and symmetries, as well as thicknesses raging from hundreds of nanometers down to a bilayer limit. This allows for fabrication of complex nanostructures and arrays thereof.

Moreover, the proposed method allows for fabrication of new morphological classes of TMDC, such as vertically stacked ultrathin TMDC nanoribbons, which opens multiple possibilities for nanophotonics, material science, catalysis, and related disciplines.

For several important applications, such as catalysis and sensing, it is important to increase the number of edge states. To reach this goal many different methods, including chemical treatment, surface engineering, thermal annealing and other emerging techniques have been employed. However, the control of these methods over the metallic-edge and semiconducting-face states is relatively limited. Thus, the present inventors realized that one must introduce a new method for nanopatterning of TMDC materials, which allows controlling this edge-face composition extremely accurately. The herein proposed method uses, in some embodiments, a combination of anisotropic dry and wet etching processes, resulting in hexagonally shaped features with atomically sharp zigzag edges over macroscopic dimensions.

Zigzag edge states are more stable than their armchair counterparts, which may explain the observed preferential etching. The edge-face composition can be controlled simply by varying the etching time. Notably, the method is capable of operating at ambient conditions and may be performed using only abundant and cheap chemicals. The herein proposed method thus allows fabricating new types of nanostructured TMDC materials, with controllable intermixed metal-edge semiconductor-face composition. The properties of these nanopatterned materials can be tailored and optimized for specific needs, thus potentially impacting such disciplines as photo- and electro-catalysis, sensing, photodetectors, quantum transport, nonlinear optics, and nanophotonics.

In accordance with an exemplary embodiment of the present disclosure the 2D material is at least one of transition metal dichalcogenides, hexagonal boron nitride, MXenes, layered transition metal oxides, layered semiconductors, layered perovskites.

According to another aspect of the present disclosure there is provided a patterned multilayer 2D material manufactured in accordance with the method according to any one of the embodiments disclosed herein. With this aspect of the disclosure, similar advantages and preferred features are present as in the previously discussed first aspect of the disclosure.

In accordance with another aspect of the present disclosure, there is provided a patterned monolayer 2D material manufactured by mechanical or chemical exfoliation of the patterned multilayer 2D material according to any one of the embodiments disclosed herein. With this aspect of the disclosure, similar advantages and preferred features are present as in the previously discussed first aspect of the disclosure.

Further embodiments of the invention are defined in the dependent claims. It should be emphasized that the term "comprises/comprising" when used in this specification is taken to specify the presence of stated features, integers, steps, or components. It does not preclude the presence or addition of one or more other features, integers, steps, components, or groups thereof.

These and other features and advantages of the present invention will in the following be further clarified with reference to the embodiments described hereinafter.

BRIEF DESCRIPTION OF THE DRAWINGS

Further objects, features and advantages of embodiments of the disclosure will appear from the following detailed description, reference being made to the accompanying drawings, in which.

DETAILED DESCRIPTION

A method for fabricating a nanostructured 2D material with atomically sharp zigzag-terminated edges of hexagonal shaped features over macroscopic dimensions will now be described with reference to FIG. 1. The 2D material here can be transition metal dichalcogenides (TMDC), hexagonal boron nitride, Mxxenes, and similar.

Figure 1:
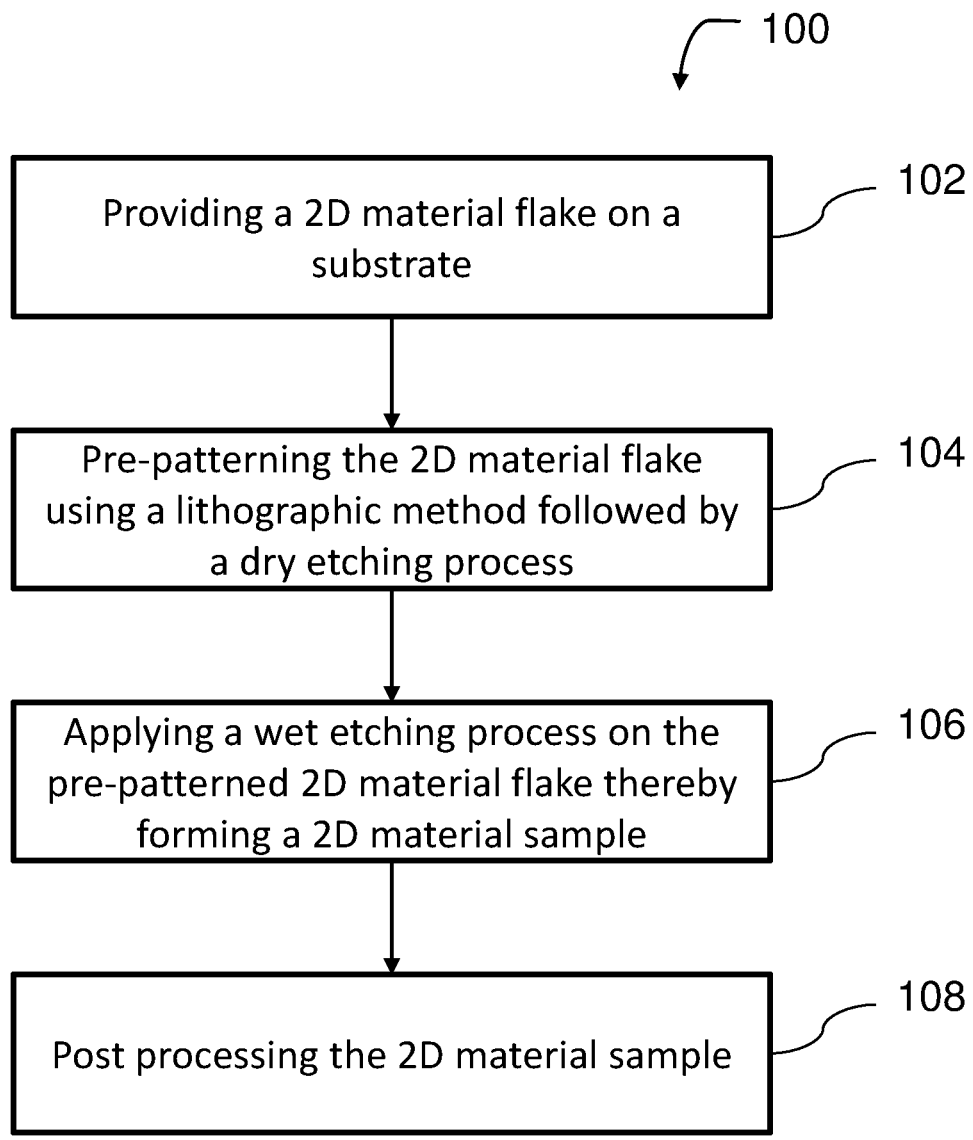
FIG. 1 is a schematic flow diagram of a method of fabricating a nanostructured 2D material with atomically sharp zigzag-terminated edges of hexagonal shaped features, according to an embodiment of the present disclosure.

FIG. 1 describes the principal idea of the fabrication method 100. In step 102, a 2D material flake is provided on a substrate. The 2D material flake comprises at least two atomic layers of the 2D material, example of 2D material is TMDCs, such as $MoS_2$, $WS_2$, $WSe_2$ and $MoSe_2$. The TMDCs are atomically thin semiconductors of the type $MX_2$, where M is a transition metal atom and X is a chalcogen atom. These 2D materials can also be firstly mechanically exfoliated on to a polymer (e.g., polydimethylsiloxane (PDMS) stamps) from a bulk crystal and then transferred on a substrate. The substrate can be any conductive or non-conductive base (e.g. glass, quartz, silicon, metallic film, silicon nitride, etc.).

In step 104, pre-patterning of the 2D material flake is performed. Pre-patterning is performed using a lithographic patterning method followed by a dry etching process. Either masked- or mask less lithography can be performed, e.g., e-beam, photolithography (UV), hole-colloidal lithography, laser-writing, etc. In one example embodiment, nanoholes are initially produced by a combination of electron beam lithography and reactive ion etching (RIE) of the $MX_2$ multilayer. Dry etching can also be performed by multiple alternatives like plasma etching, physical removal or a combination of chemical reaction and physical removal. The nanoholes obtained after pre-patterning can be varying shape and size ranging from 50 nm in diameter to 10 micron holes.

In step 106, the pre-patterned 2D material flake are subsequently exposed to a wet chemical etchant. Within a few minutes of exposure, the pre-patterned arbitrary shaped nanoholes are converted into hexagonal patterns, irrespectively of the shape and size of the original design. Scanning electron microscopy (SEM) images show that sidewalls of the obtained hexagons are sharp, suggesting they might be atomically flat. This is for example confirmed by atomic resolution transmission electron microscopy (TEM). Moreover, the orientation of the hexagonal pattern is identical to the principal crystallographic axes of TMDC (2D material), suggesting the etching mechanism is self-limiting by the edge states. The mechanism of the anisotropic etching is hypothesized to be related to energetics of the different edge states with stability increasing in the row: armchair side edge <zigzag side edge<basal plane. The duration of wet etching may vary depending on the aqueous solution used for etching and also on size, shape of the pre-patterned holes. In accordance with an embodiment of the present disclosure, the pre-etched samples were immersed in aqueous solution, composed of $H_2O_2$:$NH_4OH$:$H_2O$ with volume ratio of 1:1:10, or $H_2O_2$: $H_2O$ with volume ratio of 1:10, at 50° C. for 15 min to perform preferential wet-chemical etching. The pre-patterned circular holes with RIE, are transformed into hexagonal-shaped holes which reveals/follows crystallographic axis of TMDC materials (2D material).

These 2D material sample then undergo post-processing to get rid of any residue, in step 108. According to the presented method the 2D material samples were rinsed in distilled water to get rid of leftover/residue chemicals and then dried with N2 gas. However it being understood, the residue remains from the 2D material sample can also be removed by using any other liquid and then dried with any inert gas.

Moreover, it should also be noted that the method presented in 'Patterning Graphene with Zigzag Edges by Self-Aligned Anisotropic Etching' Shi, Z., et al., Advanced Materials, 2011. 23(27): p. 3061-3065 is suitable only for multilayer and monolayer graphene, while its suitability for other classes of two-dimensional materials has not been verified. Moreover, it is not obvious that this method is suitable for universal anisotropic dry etching of two-dimensional materials, because chemical properties of graphene (which consists of only carbon atoms) are very different from chemical properties of other two-dimensional materials (which often comprise two or more different atoms).

Figure 2:
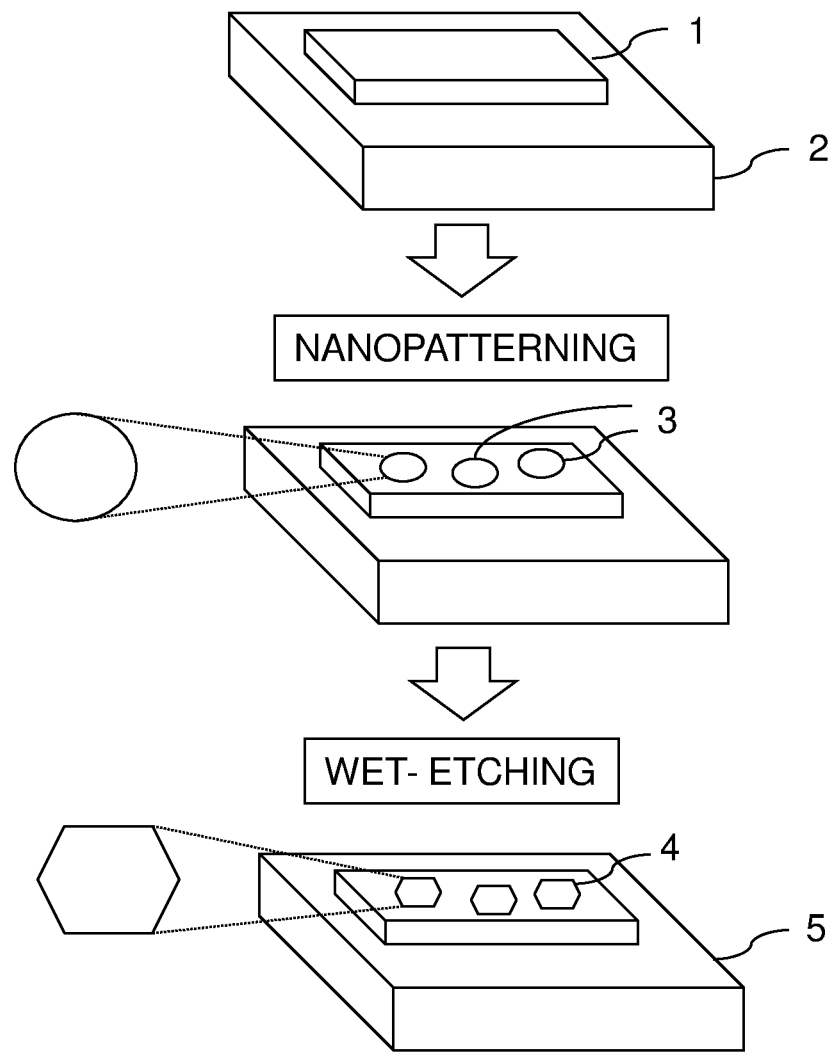
FIG. 2 is a schematic illustration of a process flow of fabricating a nanostructured 2D material with atomically sharp zigzag-terminated edges of hexagonal shaped features over macroscopic dimensions, according to an embodiment of the present disclosure.

FIG. 2 is a schematic of a process flow of fabricating a nanostructured 2D material with atomically sharp zigzag-terminated edges of hexagonal shaped features over macroscopic dimensions, according to an embodiment.

The method forming a nanostructured 2D material starts with a bulk crystal source of 2D material. In some embodiments, a mono- and multilayer 2D material flake 1, e.g., transition metal dichalcegonide (TMDC) can be exfoliated onto a polymer, e.g. polydimethylsiloxane (PDMS) stamps from the bulk crystal source. The 2D material flake is then provided on a substrate 2. The substrate can be a conductive or non-conductive base, (e.g. glass, quartz, silicon, metallic film, silicon nitride, etc.). The 2D material flake comprising at least two atomic layers of the 2D material. The 2D material here can be transition metal dichalcogenides (TMDC), hexagonal boron nitride, MXenes, and similar. The 2D material flake are then pre-patterned using a lithographic patterning method followed by a dry etching process in order to form an array of arbitrary shaped nanoholes 3 in the 2D material flake. The pre-patterned 2D material flake undergo a wet etching process such that the pre-patterned arbitrary shaped nanoholes are transformed into hexagonal patterns 4 thereby forming a 2D material sample 5. These hexagonally shaped patterns are atomically sharp zigzag edges over macroscopic dimensions. Finally, post processing the 2D material sample in order to remove any unwanted residues.

As mentioned above, the pre-patterned shaped nanoholes are transformed into hexagonal patterns after the second etching process. It should be noted that the hexagonal patterns obtained are irrespective of the shape and size of the original design. The only difference observed is the small circular holes turn into hexagonal holes rapidly, while bigger are reaching their final stage slower. For example, an initial single circular hole with diameter ranging from 50 nm to as large as 10 micron can be fully etched into a perfect hexagonal hole in 10-20 minutes using an aqueous etchant solution, composed of $H_2O_2:NH_4OH:H_2O$ with varying volume ratio at temperature ranging from T=40-60 C. In one example embodiment, the pre-patterned circular holes of 2 μm is fully etched into hexagonal hole structure within 15 min using an aqueous etchant solution, composed of $H_2O_2:NH_4OH:H_2O$ with volume ratio of 1:1:10 at T=50 C. The wet etching process can also be performed with different etchant solution, e.g. an etchant solution composed of $H_2O_2:H_2O$ (1:10) under the same condition transforms the initial circular holes into hexagonal holes under abovementioned pure $H_2O_2$ etchant, but with slightly slower etching rate. This states that various concentrations of the chemicals and slightly different conditions such as temperature, can be used to control the etching rate. It should be understood that other potential wet etchants can work in a similar manner.

Also, since the wet etching performed here has an inside out approach thus, the resultant hexagonal features have atomically sharp zigzag edges over macroscopic dimensions. Moreover, the obtained hexagonal features may be regular hexagonal features and/or irregular hexagonal features. An irregular hexagon may be understood as a six-sided shape whose sides are not equal. Moreover, the hexagonal features (regular or irregular) may further have rounded vertices.

Further, the etchant solution used in the present disclosure may provide better results by eliminating the problem of bubble formation. These bubbles prevent facile delivery of new etchant towards the material surface and thus could lead to the slow-down of the reaction. This in turn affects the final result. Due to this this effect, a generic bull-eye and doughnut structures were fabricated, since the inner disks are not etched properly. To investigate how sharp the edges, the sample can be investigated using TEM. TEM data, such as electron diffraction, provides evidence of the high crystal quality of the material. The data indicates sharp edges, with 3-5 layers of disordered material. Fourier analysis and electron energy loss spectroscopy (EELS) unambiguously signals that the edges are exclusively zigzag terminated.

The more complicated geometries, such as extended regular patterns can be achieved on the basis of individual nanoholes etching. The advantage of extended structures, such as arrays of holes, is that one can deterministically control the principal axes of the nanostructured array with respect to the crystallographic axes of TMDC, thereby obtaining a multitude of interesting morphologies. The obtained walls are still sharp as for the single hole, suggesting the method is scalable. Additionally, the method allows to accurately controlling the morphology over large areas, which could be useful for e.g. nanophotonics applications. The optical images of the arrays of holes exhibit distinct colors, which appear due to structures of the arrays. This is known as structural color. Thus, the results suggest that patterned TMDCs can be used for structural color applications. Fabrication of ultrathin nanoribbons opens a yet another application area, which may have drastically different properties, as it is a new type of material, a quasi-two-dimensional vertically stacked nanoribbons. The material, optical, and excitonic properties of these nanoribbons may be drastically different from the conventional material. Ultrathin nanoribbons can be formed by slowing down of the wet etching process upon the reaction reaching the crystallographic axes of the material. This allows controlling the edge-to-edge thickness in the array rather accurately. The limit of this process is specifically aiming at reducing this thickness down to just few nanometers which allows to observe and obtain drastically different properties.

The method described herein allows to obtain an anisotropically patterned multilayer directly by etching any number of layers in the multilayer, from a bilayer to bulk. The monolayer, however, cannot be directly etched. Despite the impossibility of direct etching of the monolayer into hexagonal shapes, such patterned monolayers can be readily obtained by exfoliating pre-patterned multilayers using a variety of well-established techniques.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

The present disclosure has been presented above with reference to specific embodiments. However, other embodiments than the above described are possible and within the scope of the disclosure. Different method steps than those described above, performing the method by hardware or software, may be provided within the scope of the disclosure. Thus, according to an exemplary embodiment of the present disclosure, there is provided a non-transitory computer-readable storage medium storing one or more programs configured to be executed by one or more processors of a computer, the one or more programs comprising instructions for performing the method according to any one of the above-discussed embodiments. The different features and steps of the embodiments may be combined in other combinations than those described.

The invention claimed is:

1. A method for forming a patterned multilayer 2D material, the method comprising:

providing a multilayer 2D material comprising at least two layers of the 2D material, pre-patterning the multilayer 2D material by using a lithographic patterning method followed by a first etching process in order to form a pre-patterned structure in the multilayer 2D material;

applying a second etching process on the pre-patterned structure such that a first shape of at least one portion of the patterned structure is transformed into a second shape thereby forming a patterned multilayer 2D material sample, wherein the second etching process is an anisotropic etching process, wherein the anisotropic etching process is a wet etching process comprising:

immersing the pre-patterned multilayer 2D material in a solution comprising an oxidizing agent, for a predefined time period at a predefined temperature.

2. A method according to claim 1, wherein the 2D material is at least one of transition metal dichalcogenides, hexagonal boron nitride, MXenes, layered transition metal oxides, layered semiconductors, layered perovskites.

3. The method according to claim 1, wherein the first shape is one of a circle, an ellipsoid or a polygon, and wherein the second shape is a regular or irregular hexagonal shape.

4. The method according to claim 1, wherein the oxidizing agent is $H_2O_2$, $NH_4OH$, or a combination thereof.

5. The method according to claim 1, further comprising post processing the patterned multilayer 2D material sample in order to remove any unwanted residues.

* * * * *